US006994917B2

(12) United States Patent
Kinoshita et al.

(10) Patent No.: US 6,994,917 B2
(45) Date of Patent: *Feb. 7, 2006

(54) COMPOSITE MATERIAL AND METHOD FOR MANUFACTURING THE SAME

(75) Inventors: Kyoichi Kinoshita, Kariya (JP); Takashi Yoshida, Kariya (JP); Tomohei Sugiyama, Kariya (JP); Hidehiro Kudo, Kariya (JP); Eiji Kono, Kariya (JP); Katsufumi Tanaka, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/755,287

(22) Filed: Jan. 9, 2004

(65) Prior Publication Data

US 2004/0142202 A1 Jul. 22, 2004

(30) Foreign Application Priority Data

Jan. 15, 2003 (JP) ............................ 2003-007337
Dec. 24, 2003 (JP) ............................ 2003-428198

(51) Int. Cl.
*H01L 23/373* (2006.01)
*B32B 3/24* (2006.01)
*B23K 20/04* (2006.01)

(52) U.S. Cl. ...................... 428/609; 428/614; 428/675; 428/676; 228/235.2; 228/190; 257/720

(58) Field of Classification Search ................ 428/609, 428/614, 596, 620, 675, 676; 228/235.2, 228/190; 257/720
See application file for complete search history.

(56) References Cited

U.S. PATENT DOCUMENTS

| | | | | |
|---|---|---|---|---|
| 2,121,469 | A * | 6/1938 | Vass | 29/6.2 |
| 4,283,464 | A * | 8/1981 | Hascoe | 428/594 |
| 5,151,777 | A * | 9/1992 | Akin et al. | 257/712 |
| 5,358,795 | A * | 10/1994 | Nakamura et al. | 428/614 |
| 5,506,062 | A * | 4/1996 | Flammang | 428/614 |
| 5,874,178 | A * | 2/1999 | Takayasu | 428/681 |
| 6,045,927 | A * | 4/2000 | Nakanishi et al. | 428/614 |
| 6,074,764 | A * | 6/2000 | Takayasu | 428/594 |
| 6,129,993 | A | 10/2000 | Kumamoto et al. | 428/614 |
| 2004/0101707 | A1 * | 5/2004 | Tanaka et al. | 428/614 |

FOREIGN PATENT DOCUMENTS

| | | |
|---|---|---|
| DE | 196 26 603 | 2/1997 |
| DE | 200 16 051 | 2/2002 |

(Continued)

*Primary Examiner*—John J. Zimmerman
(74) *Attorney, Agent, or Firm*—Morgan & Finnegan, LLP

(57) ABSTRACT

A plate of an expanded metal and two metal plates are overlaid on one another. The expanded metal plate has a plurality of meshes. The linear expansion coefficient of the expanded metal is equal to or less than $8\times10^{-6}$/° C., and the thermal conductivity of the metal plates is equal to or more than 200 W/(m·K). Then, the metal plates and the expanded metal plate are subjected to hot rolling to be rolled and joined. The rolling and joining are performed in two stages. In the first stage, the meshes of the expanded metal plate are filled with the material of the metal plates. In the second stage, the rolling and joining are performed such that the composite material has a predetermined thickness. The volumetric ratio of the expanded metal plate to the composite material is in a range between 20% and 70%, inclusive. The composite material, which has an improved thermal conductivity and strength and is suitable for heat dissipating substrate, is manufactured at a reduced cost.

13 Claims, 4 Drawing Sheets

FOREIGN PATENT DOCUMENTS

| | | | | |
|---|---|---|---|---|
| EP | 0 385 605 | A2 | | 9/1990 |
| EP | 0 437 656 | | | 7/1991 |
| EP | 0 550 999 | | | 7/1993 |
| EP | 1 406 298 | A1 | | 4/2004 |
| EP | 1 422 756 | A1 | | 5/2004 |
| JP | 63-020448 | | | 2/1988 |
| JP | 63-020449 | | | 2/1988 |
| JP | 4-182084 | | | 6/1992 |
| JP | 6-077365 | | | 3/1994 |
| JP | 6-334074 | | | 12/1994 |
| JP | 07-249717 | | * | 9/1995 |
| JP | 9-1361 | | | 1/1997 |
| JP | WO 03/021669 | A1 | * | 3/2003 |

* cited by examiner

COMPOSITE MATERIAL AND METHOD FOR MANUFACTURING THE SAME

BACKGROUND OF THE INVENTION

The present invention relates to a composite material and a method for manufacturing the composite material. More specifically, the present invention pertains to a composite material that is suitable for a heat dissipating substrate on which electronic components, such as semiconductor devices, are mounted, and a method for manufacturing the composite material.

Since electronic components such as semiconductor devices produce heat during operation, such components need to be cooled so that the performance will not lowered. Therefore, semiconductor devices are typically mounted on a base member with a heat radiator plate (heat dissipating substrate) in between.

FIG. 9 shows an aluminum base 41, which constitute a casing, and a heat sink 42, which is secured to the aluminum base 41 by screws (not shown) or by soldering. An insulated substrate 43 is secured to the heat sink 42 by soldering. The insulated substrate 43 has metal (Al) layers 43*a* on both sides. An electronic component 44 such as a semiconductor device is implemented onto the upper metal layer 43*a* of the insulated substrate 43 by soldering. The insulated substrate 43 is made of aluminum nitride (AlN). The heat sink 42 is made of a material having a low expansion coefficient and a high thermal conductivity. Specifically, the heat sink 42 is made of metal matrix composite, which has ceramics dispersed in a metal matrix layer. For example, a composite having SiC particles dispersed in an aluminum base material is used.

The metal matrix composite material used for the heat sink 42 is expensive and has low workability. Therefore, a different material for heat dissipating substrates that is inexpensive and has high workability has been proposed. For example, Japanese Laid-Open Patent Publication No. 6-77365 discloses a material for heat dissipating substrates, which is formed by integrating metal plates and a wire fabric sheet. The metal plates are made of Cu, Cu and W (tungsten), or Cu and Mo (molybdenum). The wire fabric sheet is woven with thin metal wires made of Mo or W. FIG. 10(*a*) shows an example of the material for heat dissipating substrates according to the publication. In this example, metal plates 46 are laid on one another with a wire fabric sheet 45 arranged in between. In this state, the metal plates 46 and the wire fabric sheet 45 are heated and rolled. This integrates the metal plates 46 with the wire fabric sheet 45 and forms a laminated plate 47.

Japanese Laid-Open Patent Publication No. 6-334074 discloses a substrate for semiconductor devices, which substrate includes a base member, in which holes are formed. The base member is made of metal or alloy, the thermal expansion coefficient of which is less than or equal to $8\times10^{-6}/°$ C. The holes are filled with highly thermal conductive material such as metal or alloy, the thermal conductivity of which is more than or equal to 210 W/(m·K). The highly thermal conductive material may be Cu, Al, Ag, Au or an alloy that is chiefly composed of Cu, Al, Ag, or Au. The base member may be an invar plate, which contains 30 to 50% Ni by weight and Fe making up the remaining proportion, or a super invar plate, which contains Co. The holes of the base member are formed by punching after processing the raw material into a flat shape. Alternatively, the holes are formed during casting by the precision casting (lost-wax process).

However, when the laminated plate 47 shown in FIG. 10(*a*) is extended by applying pressure, spaces Δ are easily formed at portions where the thin metal wires 45*a* overlap with each other and in the vicinity of the overlapped portions as shown in FIG. 10(*b*). Air in the spaces Δ deteriorates the thermal conductivity. Also, cracks are easily formed in the wire fabric sheet 45 at the spaces Δ by the repeated thermal expansion and thermal contraction. This reduces the strength of the laminated plate 47. To improve the strength of the wire fabric sheet 45, the contact points of the thin metal wires 45*a* may be welded. However, it is difficult to weld the contact points of the wire fabric sheet 45, since the wire fabric sheet 45 is woven with the thin metal wires 45*a* and has fine meshes.

The volumetric ratio of metal having a low thermal expansion coefficient needs to be maximized to suppress the thermal expansion coefficient of the material for heat dissipating substrates. However, in a material using the wire fabric sheet 45, metal exists not only in the meshes, which correspond to holes, but also in portions 47*a* (see FIG. 10(*a*)) that correspond to bent portions of the thin metal wires 45*a* of the fabric sheet 45. Therefore, compared to a structure where a flat metal plate having holes is surrounded with metal, it is difficult to increase the volumetric ratio of a metal having a low thermal expansion coefficient.

The substrate for semiconductor devices disclosed in Japanese Laid-Open Patent Publication No. 6-334074 does not have the drawbacks caused when the wire fabric sheet 45 is used. If holes are formed by punching after processing a raw material into a flat plate, the yield rate decreases, which increases the material cost. Also, forming holes by precision casting (lost wax) increases the manufacturing cost.

SUMMARY OF THE INVENTION

Accordingly, it is a first objective of the present invention to provide a composite material that has an improved strength and a reliable thermal conductivity, and is suitable for heat dissipating substrate. A second objective of the present invention is to provide a method for manufacturing the composite, which method reduces the manufacturing cost.

To achieve the above-mentioned objective, the present invention provides a composite material. The composite material is formed by combining a first member and a second member. The first member is a plate of an expanded metal having a plurality of meshes. The linear expansion coefficient of the expanded metal is equal to or less than $8\times10^{-6}/°$ C. The second member is a metal plate. The thermal conductivity of the metal plate is equal to or more than 200 W/(m·K). The meshes of the expanded metal plate is filled with a material of the metal plate. The volumetric ratio of the expanded metal plate to the composite material is in a range between 20% and 70%, inclusive.

According to another aspect of the invention, a method for manufacturing a composite material is provided. The method includes overlaying at least one plate of an expanded metal and at least one metal plate on each other. The expanded metal plate has a plurality of meshes. The linear expansion coefficient of the expanded metal is equal to or less than $8\times10^{-6}/°$ C. The thermal conductivity of the metal plate is equal to or more than 200 W/(m·K). The method includes rolling and joining the expanded metal plate and the metal plate such that the material of the metal plate fills the meshes of the expanded metal plate. The volumetric ratio of the expanded metal plate to the composite material is in a range between 20% and 70%, inclusive.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1(*b*) is also a schematic cross-sectional view showing the method of FIG. 1(*a*);

FIG. 4(*b*) is a vertical cross-sectional view schematically showing the plate of the composite material;

FIG. 4(*c*) is a partially enlarged cross-sectional view of FIG. 4(*b*);

FIG. 5(*b*) is a cross-sectional view taken along line 5(*b*)—5(*b*) of FIG. 5(*a*);

FIG. 10(*b*) is a partially enlarged view of FIG. 10(*a*).

DETAILED DESCRIPTION OF THE PREFERRED EMBODIMENTS

One embodiment according to the present invention will now be described with reference to FIGS. 1 to 7.

Figure 1A:
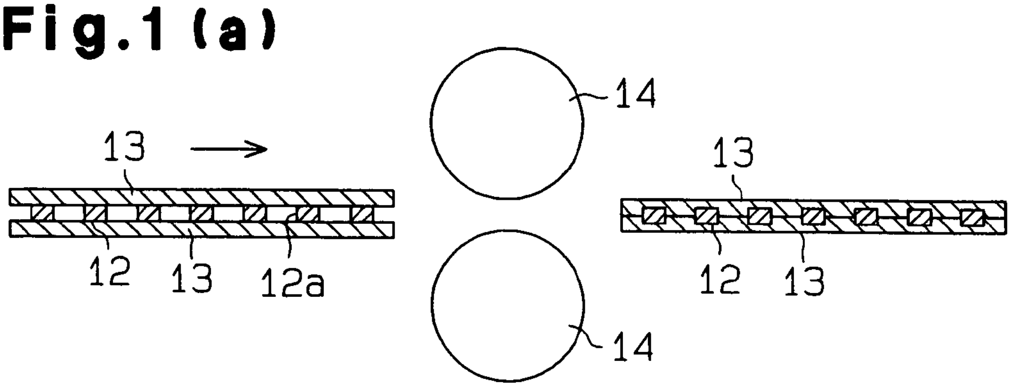
FIG. 1(*a*) is a schematic cross-sectional view showing a method for manufacturing a plate made of a composite material according to one embodiment of the present invention.
Figure 1B:
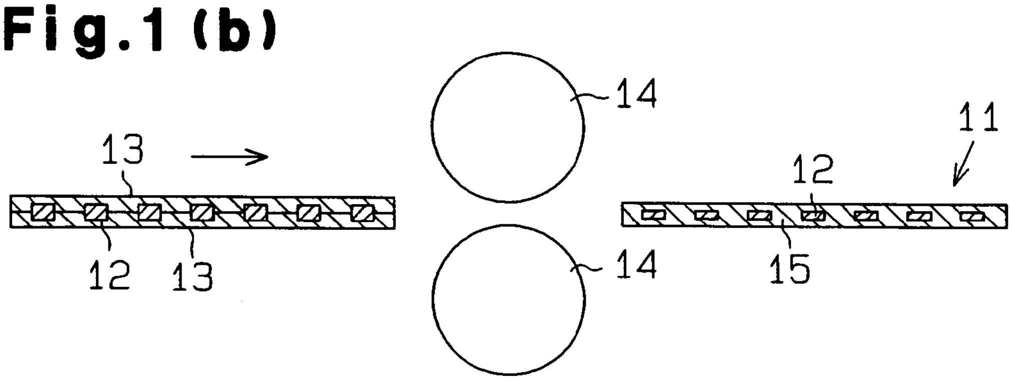
Figure 2:
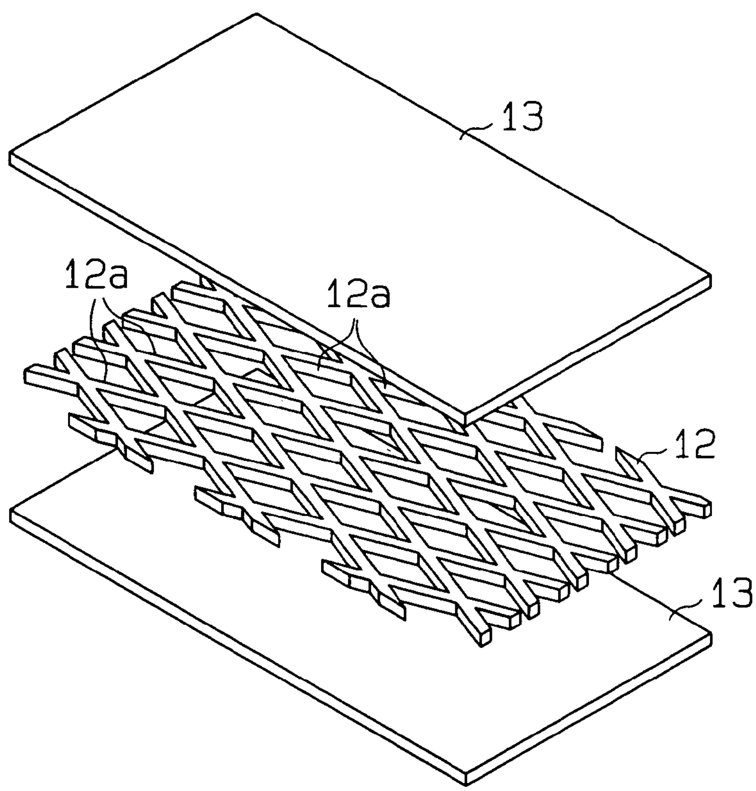
FIG. 2 is a schematic perspective view showing metal plates and an expanded metal plate forming the plate of the composite material.

FIGS. 1(*b*), 4(*a*), and 4(*b*) show a plate 11 of a composite material according to this embodiment. The composite material plate 11 is formed by arranging a first member, which is a plate 12 of an expanded metal, between two second members, which are two metal plates 13, and then rolling the expanded metal plate 12 and metal plates 13 so that the plate 12 and the plates 13 are integrated. More specifically, as shown in FIGS. 1(*a*) and 1(*b*), the metal plates 13 and the expanded metal plate 12, which is arranged between the metal plates 13, are heated and extended by a pair of rollers 14. As a result, the metal plates 13 and the expanded metal plate 12 are integrated into the composite material plate 11. Expanded metal refers to a structure like a wire netting formed by expanding a metal plate with alternate slits.

Rolling and joining are not performed in a single stage, but in two or more stages (in this embodiment, two stages). In a first stage, or a filling step, meshes 12*a* of the expanded metal plate 12 are filled with part of the metal plates 13 as shown in FIG. 1(*a*). In a second stage, the expanded metal plate 12 and the metal plates 13 are joined by rolling to have a predetermined thickness as shown in FIG. 1(*b*). The reduction ratio at the last stage (in this embodiment, at the second stage) is adjusted to be the maximum value in a permissible range of reduction ratio. The reduction ratio is determined in consideration of the thickness of the finished product, and preferably equal to or more than 30%. A reduction ratio that is less than 30% would result in an insufficient boding strength between the expanded metal plate 12 and the metal plates 13. Also, at the completion of the hot rolling, spaces would exist in parts of the metal plates 13. Therefore, the thermal conductivity would be lowered.

Figure 4A:
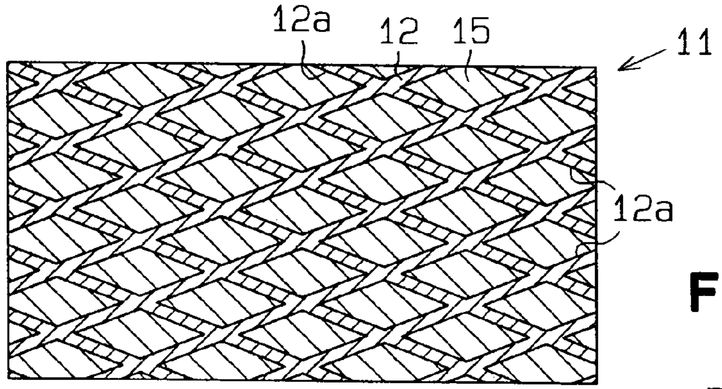
FIG. 4(*a*) is a horizontal cross-sectional view schematically showing the plate of the composite material.
Figure 4C:
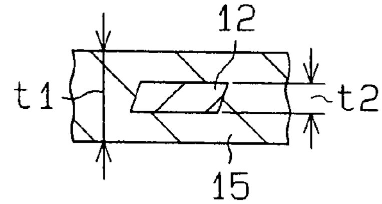
Figure 4B:
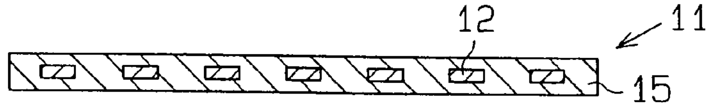

When the thickness of the composite material plate 11 and the thickness of the expanded metal plate 12 after rolling and joining are referred to as t1, t2 as shown in FIG. 4(*a*), respectively, the thickness of the expanded metal plate 12 and each metal plate 13 prior to rolling and joining, and the reduction ratio of the rolling and joining are determined such that (t2)/(t1) is between 0.2 and 0.8, inclusive. If (t2)/(t1) is less than 0.2, it will be difficult to set the volumetric ratio Vf of the expanded metal plate 12 to the composite material plate 11 at 20% or greater. If (t2)/(t1) exceeds 0.8, it will be difficult to set the volumetric ratio Vf equal to less than 70%.

By combining the expanded metal plate 12 and the metal plates 13, the composite material plate 11 formed with the expanded metal plate 12 and a matrix metal 15 surrounding the expanded metal plate 12 as shown in FIGS. 1(*b*), 4(*a*), and 4(*b*) is formed. The composite material plate 11 is used as a material for a heat dissipating substrate (for example, a heat sink) on which semiconductor devices are mounted.

The thicknesses of the expanded metal plate 12 and the metal plates 13, which are combined, and the size of the meshes 12*a* of the expanded metal plate 12 are determined such that the volumetric ratio Vf of the expanded metal plate 12 to the composite material plate 11 is between 20% and 70%, inclusive. If the volumetric ratio Vf is less than 20%, the linear expansion coefficient of the composite material will be insufficient. If the volumetric ratio Vf exceeds 70%, the thermal conductivity of the composite material will be insufficient.

The linear expansion coefficient of the expanded metal plate 12 is equal to or less than $8\times10^{-6}$/° C. In this embodiment, the expanded metal plate 12 is made of an invar plate, which is an Fe and Ni based alloy including 36% Ni by weight. The thermal conductivity of the metal plates 13, which are combined with the expanded metal plate 12, is more than or equal to 200 W/(m·K). In this embodiment, the metal plates 13 made of Cu.

Figure 6:
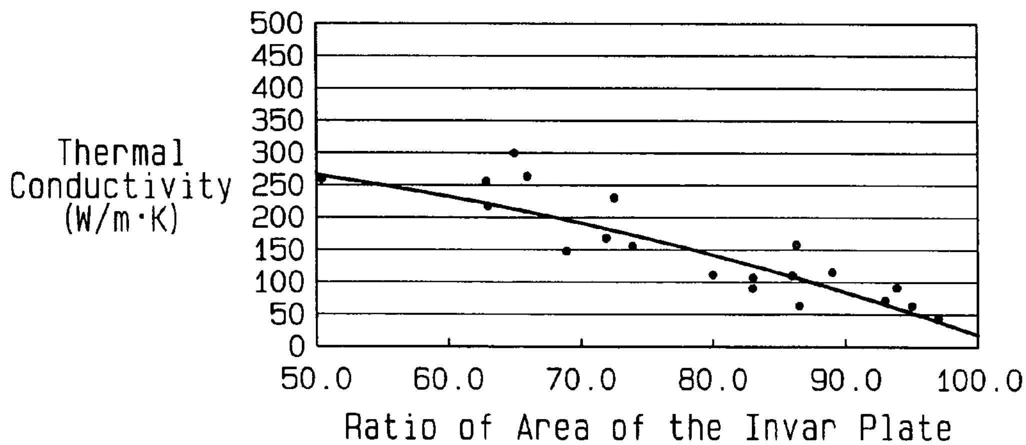
FIG. 6 is a graph showing the relationship between the thermal conductivity of the composite and the ratio of area of an invar plate.

When manufacturing the composite material plate 11 having a desired thermal expansion coefficient, the shape of the expanded metal plate 12, the thickness of the expanded metal plate 12, and the thickness of the metal plates 13 are determined in the following manner. Through experiments, it has been confirmed that the thermal conductivity λ of the composite material is approximately expressed by the following equation (1), which is formulated on the assumption that the law of mixture holds. FIG. 6 shows experiment results with dots, which represent the relationship between the ratio of area (%) of the invar plate and the thermal conductivity λ (W/(m·K)) of a composite material formed by combining the expanded metal plate 12 made of the invar plate and the two metal plates 13 made of Cu. FIG. 6 also shows the theoretical values of the equation (1).

$$\lambda=\lambda_{Cu}(\lambda_{Cu}(1-S)+\lambda_{Iv}S)/(\lambda_{Cu}(1-S+tS)+\lambda_{Iv}(1-t)S) \quad (1)$$

t represents the ratio of thickness of the invar plate, S represents the ratio of area of the invar plate, $\lambda_{Cu}$ represents the thermal conductivity of Cu, $\lambda_{Iv}$ represents the thermal conductivity of the invar plate. The ratio of area S of the invar plate represents the ratio of the cross-sectional area of the expanded metal plate 12 to the total cross-sectional area of the composite material plate 11 shown in FIG. 4(*a*). If the composite material plate 11 is entirely made of the invar plate, S will be one, and if no invar plate is used in the composite material plate 11, S will be zero.

The thermal expansion coefficient β of the composite material plate 11 is represented by the following equation (2) on the assumption that the rule of mixture holds.

$$\beta=(1-S)\beta_{Cu}+S((1-\nu_{Iv})\beta_{Cu}E_{Cu}(1-t)+(1-\nu_{Cu})\beta_{Iv}E_{Iv}t)/((1-\nu_{Iv})E_{Cu}(1-t)+(1-\nu_{Cu})E_{Iv}t) \quad (2)$$

$\beta_{Cu}$ represents the thermal expansion coefficient of Cu, and $\beta_{Iv}$ represents the thermal expansion coefficient of the invar plate. $E_{Cu}$ represents the Young's modulus of Cu, and $E_{Iv}$ represents the Young's modulus of the invar plate. $\nu_{Cu}$ represents the Poisson's ratio of Cu, and $\nu_{Iv}$ represents the Poisson's ratio of the invar plate.

Figure 7:
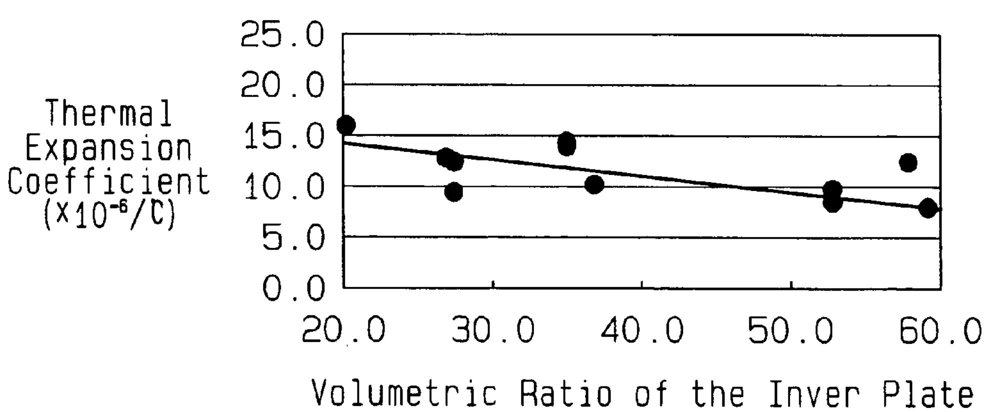
FIG. 7 is a graph showing the relationship between the thermal expansion coefficient of the composite and the volumetric ratio of the invar plate.

Through experiments, it has been confirmed that the equation (2) is approximately the same as the Kerner equation containing the volumetric ratio $V_{IV}$ of the invar plate, and the thermal expansion coefficient β is represented by the following equation (3). FIG. 7 shows experiment results with dots, which represent the relationship between volumetric ratio (%) of the invar plate and the heat expansion coefficient (×10$^{-6}$/° C.) of the composite material formed by combining the expanded metal plate 12 made of the invar plate and the two metal plates 13 made of Cu. FIG. 7 also shows the theoretical values of the equation (3).

$$\beta=((1-\nu_{Iv})\beta_{Cu}E_{Cu}(1-V_{IV})+(1-\nu_{Cu})\beta_{Iv}E_{Iv}V_{IV})/(((1-\nu_{Iv})E_{Cu}(1-V_{IV})+(1-\nu_{Cu})E_{Iv}V_{IV})) \quad (3)$$

Therefore, at first, a value of the volumetric ratio $V_{IV}$ of the invar plate that corresponds to a target value of the thermal expansion coefficient β of the composite material plate 11 is selected. Also, a value of the ratio of area S of the invar plate that corresponds to a target value of the thermal conductivity λ of the composite material plate 11 is selected. When manufactured to satisfy these conditions, the composite material plate 11 is suitable for a heat dissipating substrate.

The volumetric ratio $V_{IV}$ of the invar plate in the composite material plate 11 is determined according to the thickness of the expanded metal plate 12 and the thickness of the metal plates 13, which are rolled and joined. The volumetric ratio $V_{IV}$ is represented by the following equation.

$V_{IV}$=(net thickness of invar plate)/((thickness of Cu)−(thickness of a portion of Cu removed by surface grinding)+(net thickness of invar plate))

If no surface grinding is performed after rolling and joining, the volumetric ratio $V_{IV}$ of the invar plate in the composite material plate 11 is represented by the following equation.

$V_{IV}$=(net thickness of invar plate)/((thickness of Cu)+(net thickness of invar plate))

The net thickness of the invar plate refers to the thickness of the invar plate when there is no space (mesh). The net thickness of the invar plate is computed in the following manner according to conditions of expanding.

Net thickness of invar plate=T/(SW/2 W)

For example, when the equation SW:LW:T:W:F=2.7:6:1:1.2:1 is satisfied and when T is 1 mm, the net thickness of the invar plate will be 0.89 mm.

Figure 5A:
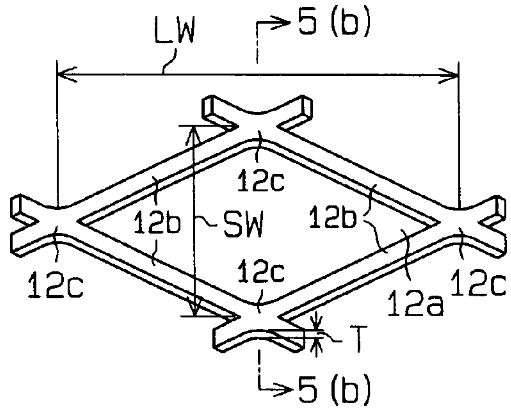
FIG. 5(*a*) is a schematic partial perspective view showing the expanded metal plate.
Figure 5B:
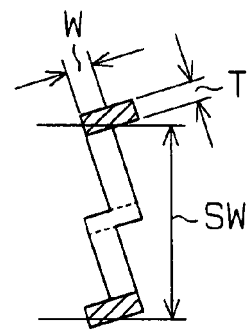

SW represents the distance (mm) between the centers of adjacent meshes arranged along a lateral direction of the expanded metal plate (see FIG. 5(*a*)). LW represents the distance (mm) between the centers of adjacent meshes arranged along the longitudinal direction of the expanded metal plate (see FIG. 5(*b*)). W represents a feeding width (mm). F represents the thickness (mm) after flattening. T represents the thickness (mm) of the plate before being expanded.

Figure 3:
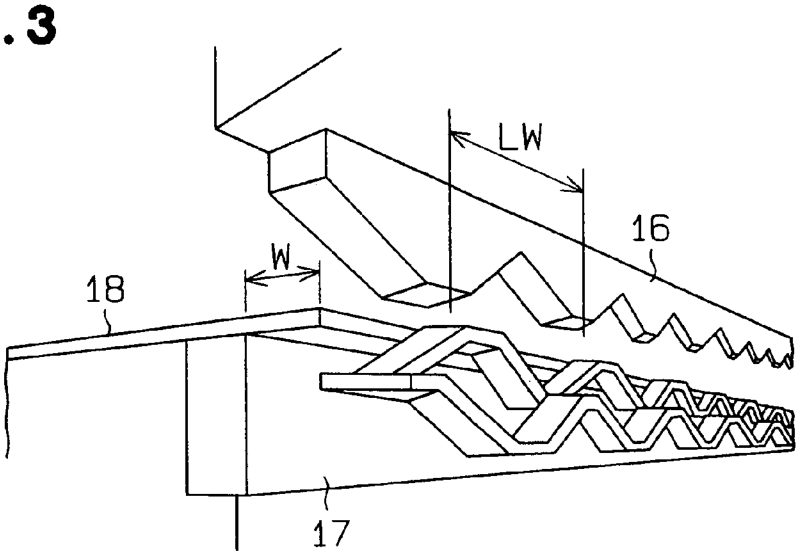
FIG. 3 is a schematic perspective view showing a method for manufacturing the expanded metal plate.

When manufacturing expanded metal plate 12, an apparatus a part of which is shown in FIG. 3 is used. The apparatus has an upper blade 16 with a number of V-shaped edges and a lower blade 17 with a linear edge. A material plate 18 is fed to a position below the upper blade 16 by a predetermined feeding width W at a time. Every time, the material plate 18 is fed, the upper blade 16 is alternately displaced by a predetermined amount (LW/2) in a direction perpendicular to the feeding direction of the material plate 18 (along the longitudinal direction of the upper blade 16). At the same time, the upper blade 16 is moved vertically at the displaced position so that lines of alternate slits are formed. Thereafter, the material plate 18 is expanded to form meshes 12*a*.

FIG. 5(*a*) is a schematic partial perspective view showing one of the meshes 12*a* of the expanded metal plate 12. FIG. 5(*b*) is a cross-sectional view taken along line 5(*b*)—5(*b*) of FIG. 5(*a*). The filled portion of the expanded metal plate 12 includes strands 12*b* and bonding portions 12*c*. The width of each strand 12*b* is equal to the feeding width W during manufacture of the expanded metal plate 12. The distance SW between the centers of an adjacent pair of the meshes 12*a* along the lateral direction is assumed to be equal to the distance between an adjacent pair of the bonding portions 12*c* along the lateral direction. The distance LW between centers of an adjacent pair of the meshes 12*a* along the longitudinal direction is assumed to be equal to the distance between an adjacent pair of the bonding portions 12*c* along the longitudinal direction.

The material plate 18, which has lines of alternately arranged slits, is expanded to form the expanded metal plate 12 with the meshes 12*a*. The surface of the expanded metal plate 12 is uneven. The expanded metal plate 12 is then rolled with flat rollers so that the strands 12*b* and the bonding portions 12*c* are in the same plane. Therefore, the sides of each strand 12*b*, which lie along the thickness direction of the composite material plate 11 formed of the expanded metal plate 12 and the metal plates 13, are not perpendicular to the surfaces of the composite material plate 11, but are inclined as shown in FIG. 4(*c*). Therefore, when the expanded metal plate 12 and the metal plates 13 are rolled with rollers 14, the contacting surfaces of the expanded metal plate 12 and the metal plates 13 are likely to receive force in a direction perpendicular to the contacting surfaces. This increases the bonding strength between the expanded metal plate 12 and the metal plates 13.

The distance SW between the centers must be equal to or more than twice the thickness of the invar plate. In some sections of the composite material plate 11, only the matrix metal 15 exists along the thickness direction. In other sections, the matrix metal 15 and the expanded metal plate 12 exist along the thickness direction. Through experiments, it has been confirmed that, if the meshes 12*a* are too large, due to the difference in thermal expansion coefficient between these sections, the influence of thermal stress is increased, and that the distance SW between the centers is preferably twice to five times the thickness of the invar plate.

The rolling performed in this embodiment is hot rolling. The temperature of the hot rolling needs to be equal to or higher than a temperature at which diffusion boding occurs between the metal plates 13, and between each metal plate 13 and the expanded metal plate 12. Accordingly, the temperature of the hot rolling needs to be a temperature at which lattice diffusion of Cu, which forms the metal plates 13, occurs. That is, the temperature of the hot rolling needs to be equal to or higher than 0.8 times the melting point of Cu on a Kelvin basis. The temperature of the hot rolling is preferably equal to or higher than 800° C. However, if the temperature is excessively high, many Cu—Ni—Fe alloy layers, the thermal conductivity of which is about 50 W/(m·K), are formed between the metal plates 13 made of Cu and the expanded metal plate 12 made of the invar plate. Thus, the temperature the hot rolling needs to be as low as possible. In the hot rolling, it is difficult to maintain a constant temperature. If the target temperature is about 800° C., the actual temperature varies in a range of ±50° C. Thus, in consideration of the capacity of the apparatus, the target temperature is preferably 850° C.

This embodiment provides the following advantages.

(1) The expanded metal plate 12, the linear expansion coefficient of which is equal to or less than $8\times10^{-6}$/° C., and the metal plates 13, the thermal conductivity of which is equal to or more than 200 W/(m·K), are overlaid on one another, and rolled to be joined. As a result, the volumetric ratio of the expanded metal plate 12 to the composite material plate 11 is 20 to 70%. Therefore, the manufactured composite material plate 11 is suitable for a heat dissipating substrate for mounting electronic components such as semiconductor devices. Also, the composite material plate 11 has improved thermal conductivity and strength compared to a case where a wire fabric sheet is used. Also, compared to cases where holes are formed in a flat metal plate by punching or precision casting, the illustrated embodiment reduces the costs.

(2) When the thickness of the composite material plate 11 and the thickness of the expanded metal plate 12 after rolling and joining are represented by t1 and t2, respectively, the thickness of the expanded metal plate 12 and each metal plate 13 prior to rolling and joining, and the reduction ratio of the rolling and joining are determined such that (t2)/(t1) is between 0.2 and 0.8, inclusive. As a result, it is easy to manufacture the composite material plate 11 having a linear expansion coefficient and a thermal conductivity that are suitable for a heat dissipating substrate to mount electronic components such as semiconductor devices.

(3) Rolling and joining of the materials are performed in two or more stages (in this embodiment, two stages). After the meshes 12*a* of the expanded metal plate 12 are filled with the material of the metal plates 13, the last stage is performed such that the reduction ratio has the maximum value in the permissible range of reduction ratio. Since unnecessary force does not need to be applied to the rollers 14 until the material of the metal plates 13 fills the meshes 12*a* of the expanded metal plate 12, the size of the apparatus is reduced compared to a case where the rolling and joining are completed in a single stage.

(4) The invar plate is used for the expanded metal plate 12, and Cu is used for the metal plates 13. Thus, the linear expansion coefficient of the composite material plate 11 can be adjusted such that the plate 11 is suitable for a heat dissipating substrate for mounting electronic components such as semiconductor devices.

(5) The composite material plate 11 is a plate in which the expanded metal plate 12 is surrounded by the matrix metal 15, which has a thermal conductivity equal to or more than 200 W/(m·K). Therefore, compared to a structure in which part of the expanded metal plate 12 is exposed on the surface of the composite material plate 11, the thermal conductivity in the horizontal direction is improved.

(6) Cu is used as the metal having a thermal conductivity equal to or more than 200 W/(m·K). Compared to a precious metal, Cu, which has a thermal conductivity equal to more than 200 W/(m·K), is inexpensive. Also, Cu improves the heat radiating property of the composite material plate 11.

(7) In this embodiment, an invar plate is used for the expanded metal plate 12, and Cu is used for the metal plates 13. Hot rolling is performed with a target temperature set at a temperature computed by adding the margin of variation of temperature control of the hot rolling apparatus to the 800° C. Therefore, even if the temperature of the hot rolling varies, many Cu—Ni—Fe alloy layers, the thermal conductivity of which is about low 50 W/(m·K) are prevented from being formed between the metal plates 13 made of Cu and the expanded metal plate 12 made of the invar plate.

The invention may be embodied in the following forms.

The rolling and joining of the expanded metal plate 12 and the metal plates 13 do not need to be performed in two stages, but may be performed in three or more stages. Alternatively, the rolling and joining may be performed in a single stage.

Figure 8:
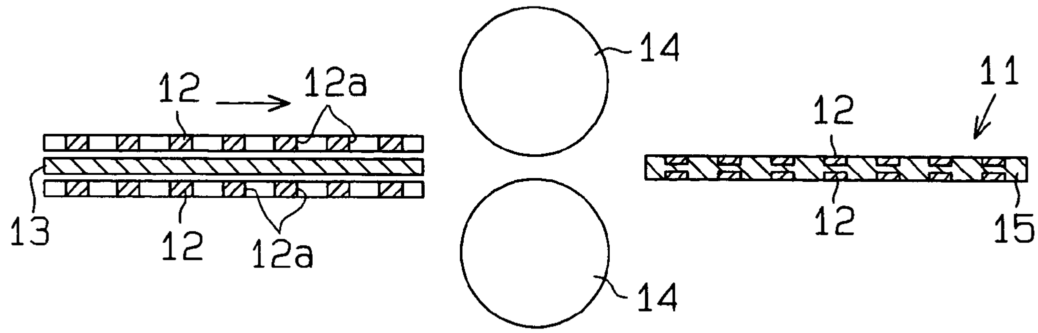
FIG. 8 is a schematic cross-sectional view showing a method for manufacturing a plate of a composite material according to another embodiment.
Figure 9:
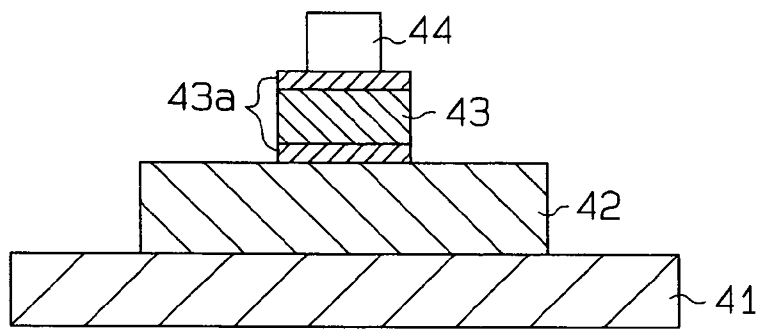
FIG. 9 is a schematic cross-sectional view showing a packaging module using a heat sink.
Figure 10A:
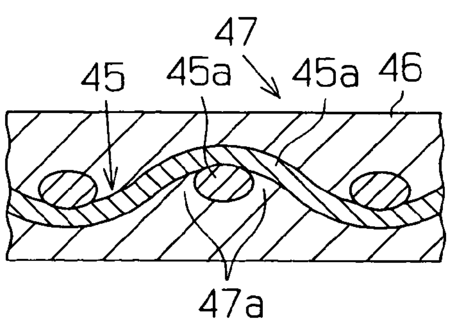
FIG. 10(*a*) is a schematic cross-sectional view showing a material for heat dissipating substrates according to a prior art.
Figure 10B:
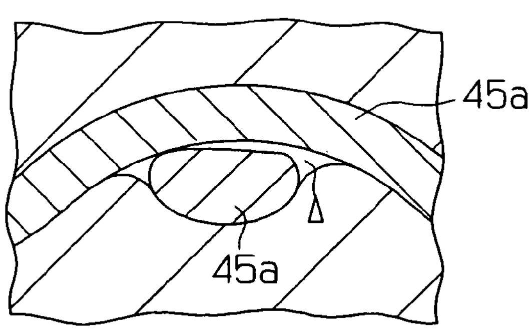

In the above illustrated embodiment, the single expanded metal plate 12 and the two metal plates 13 are rolled and joined. However, the present invention may be applied to a case where the number of the expanded metal plate 12 and the metal plate 13 are different from the above embodiment. For example, as shown in FIG. 8, the present invention may be applied to a case where a single metal plate 13 is held between two expanded metal plates 12. In this case, the expanded metal plates 12 are exposed at the sides of the composite material plate 11. Compared to a case wherein the entire expanded metal plate 12 is surrounded by the metal having a thermal conductivity equal to or more than 200 W/(m·K), thermal expansion at the surfaces of the composite material plate 11 is effectively prevented.

When manufacturing the expanded metal plate 12, using a thinner material plate 18 makes it easier to form finer meshes 12*a*. Therefore, if the volumetric ratio of the expanded metal plate 12 to the matrix metal 15 is constant, using two or more expanded metal plates 12 as shown in FIG. 8 makes it easier to form finer meshes 12*a* compared to a case where only one expanded metal plate 12 is used. As a result, a homogeneous composite material plate 11 is obtained. Therefore, when attempting to form a composite material plate 11 having a desired value of thermal expansion coefficient according to the equation (3) based on the volumetric ratio $V_{IV}$ of the invar plate in the composite material plate 11, the accuracy of the actual thermal expansion coefficient of the manufactured composite material plate 11 is improved.

The material for the expanded metal plate 12 is not limited to the invar plate. That is, any type of metal plate may be used as long as the linear expansion coefficient is equal or less than $8\times10^{-6}$/° C. For example, a plate of another invar alloy such as super invar and stainless invar, or fernico (54% Fe by weight, 31% Ni by weight, 15% Co by weight, the linear expansion coefficient of which is $5\times10^{-6}/°$ C.) may be used.

When using two or more expanded metal plates 12, the material of the expanded metal plates 12 may be different. However, parts of the expanded metal plates that are located at symmetrical positions with respect to a plane containing the center of the composite material plate 11 in the thickness direction are preferably made of the same material. This configuration prevents the composite material plate 11 from curling even if there is a difference in the thermal expansion coefficient in the different materials.

The matrix metal 15 does not need to be made of Cu. That is, the matrix metal 15 may be any metal as long as the coefficient of thermal conductivity is more than or equal to 200 W/(m·K). For example, aluminum-based metal or silver may be used. The aluminum-based metal refers to aluminum or aluminum alloy. The thermal conductivity of the aluminum-based metal is low as compared to that of Cu. The melting point of the aluminum-based metal (aluminum) is 660° C., which is significantly lower than the melting point of the copper, which is 1085° C. This reduces the manufacturing cost as compared to the copper. Aluminum-based metal is also preferable in view of weight reduction.

The composite material plate 11 may be applied to heat sinks other than a heat dissipating substrate for mounting semiconductor devices.

Therefore, the present examples and embodiments are to be considered as illustrative and not restrictive and the invention is not to be limited to the details given herein, but may be modified within the scope and equivalence of the appended claims.

What is claimed is:

1. A composite material for a heat dissipating substrate on which an electronic component is mounted, wherein the composite material is formed by combining a first member and a second member, wherein the first member is a plate of an expanded metal including a plurality of strands and a plurality of bonding portions that bond the strands together, and the strands and the bonding portions define meshes wherein the expanded metal plate is flat so that the strands and the bonding portions are in the same plane, and wherein sides of each strand, which lie along the thickness direction of the composite material, are not perpendicular to a surface of the composite material, and wherein the linear expansion coefficient of the expanded metal is equal to or less than $8\times10^{-6}/°$ C., wherein the second member is a metal plate the thermal conductivity of which is equal to or more than 200 W/(m·K), wherein the meshes of the expanded metal plate is filled with a material of the metal plate, and wherein the volumetric ratio of the expanded metal plate to the composite material is in a range between 20% and 70%, inclusive.

2. A method for manufacturing a composite material for a heat dissipating substrate on which an electronic component is mounted, comprising:

rolling an expanded metal plate, including a plurality of strands and a plurality of bonding portions that bond the strands together, the strands and the bonding portions defining meshes, with flat rollers so that the strands and the bonding portions are in the same plane, wherein sides of each strand, which lie along the thickness direction of the expanded metal plate, are not perpendicular to a surface of the expanded metal plate;

overlaying the expanded metal plate and a metal plate on each other, wherein the linear expansion coefficient of the expanded metal is equal to or less than $8\times10^{-6}/°$ C., and the thermal conductivity of the metal plate is equal to or more than 200 W/(m·K); and rolling and joining the expanded metal plate and the metal plate such that the material of the metal plate fills the meshes of the expanded metal plate, wherein the volumetric ratio of the expanded metal plate to the composite material is in a range between 20% and 70%, inclusive.

3. The method for manufacturing a composite material according to claim 2, further comprising determining the thicknesses of the expanded metal plate and the metal plate prior to the rolling and joining and the size of the meshes of the expanded metal plate prior to the rolling and joining such that the volumetric ratio of the expanded metal plate to the composite material is in a range between 20% and 70%, inclusive.

4. The method for manufacturing a composite material according to claim 2, wherein the thicknesses of the expanded metal plate and the metal plate prior to rolling and joining, and the reduction ratio of the rolling and joining are determined such that, if the thickness of the composite material and the thickness of a part of the composite material constituted by the expanded metal after the rolling and joining are represented by t1 and t2, respectively, (t2)/(t1) is in a range between 0.2 and 0.8, inclusive.

5. The method for manufacturing a composite material according to claim 2, wherein the rolling and joining include:

filling the meshes of the expanded metal plate with the material of the metal plate; and rolling and joining the expanded metal plate and the metal plate, which are overlaid on each other, at a predetermine reduction ratio after the filling the meshes.

6. The method for manufacturing a composite material according to claim 5, wherein the reduction ratio is determined to be the maximum value in a permissible range of reduction ratio.

7. The method for manufacturing a composite material according to claim 2, wherein an invar is used as the material of the expanded metal, and wherein Cu is used as the material of the metal plate.

8. The method for manufacturing a composite material according to claim 7, wherein the rolling is hot rolling, and wherein the temperature of the hot rolling is computed by adding a margin of variation of temperature control of an apparatus of hot rolling to the 800° C.

9. The method for manufacturing a composite material according to claim 7, wherein the volumetric ratio of the invar to the composite material with the thermal expansion coefficient of the composite material being set to a desired value is computed using a predetermined equation that is formulated on the assumption that the law of mixture holds, and the expanded metal plate and the metal plate are rolled and joined such that the volumetric ratio of the invar to the manufactured composite material is the value computed using the equation.

10. The method for manufacturing a composite material according to claim 9, wherein the equation expresses the thermal expansion coefficient of the composite material using the thermal expansion coefficient, the Young's modulus, and the Poisson's ratio of each of the invar and Cu, and the volumetric ratio of the invar to the composite material.

11. The method for manufacturing a composite material according to claim 2, wherein the metal plate is one of a plurality of metal plates, and wherein the rolling and joining are performed with the expanded metal plate being held between the metal plates.

12. The method for manufacturing a composite material according to claim 2, wherein the expanded metal plate is one of a plurality of expanded metal plates, and wherein the rolling and joining are performed with the metal plate being held between the expanded metal plates.

13. A method for manufacturing a composite material for a heat dissipating substrate on which an electronic component is mounted, comprising:

rolling an expanded metal plate made of invar, including a plurality of strands and a plurality of bonding portions that bond the strands together, the strands and the bonding portions defining meshes, with flat rollers so that the strands and the bonding portions are in the same plane, wherein sides of each strand, which lie along the thickness direction of the expanded metal plate, are not perpendicular to a surface of the expanded metal plate;

holding the expanded metal plate between a pair of metal plates, wherein the linear expansion coefficient of the expanded metal is equal to or less than $8\times10^{-6}$/° C., and the thermal conductivity of the metal plates is equal to or more than 200 W/(m·K); and rolling and joining the expanded metal plate and the metal plates such that the material of the metal plates fills the meshes of the expanded metal plate, wherein the volumetric ratio of the expanded metal plate to the composite material is in a range between 20% and 70%, inclusive.

* * * * *

UNITED STATES PATENT AND TRADEMARK OFFICE

CERTIFICATE OF CORRECTION

PATENT NO. : 6,994,917 B2 
APPLICATION NO. : 10/755287
DATED : February 7, 2006
INVENTOR(S) : Kyoichi Kinoshita et al.

It is certified that error appears in the above-identified patent and that said Letters Patent is hereby corrected as shown below:

<u>In the Specification</u>

Column 8, line 16, please delete “equal to more” and insert therefore -- equal to or more --

<u>In the claims</u>

Claim 5 at column 10, lines 37-38, please delete “predetermine” and insert therefore -- predetermined --

Signed and Sealed this

Fifth Day of September, 2006

JON W. DUDAS
*Director of the United States Patent and Trademark Office*